(12) United States Patent
Feng

(10) Patent No.: US 10,475,795 B2
(45) Date of Patent: Nov. 12, 2019

(54) INSULATING STRUCTURE AND METHOD OF FORMING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventor: Li-Wei Feng, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/729,682

(22) Filed: Oct. 11, 2017

(65) Prior Publication Data

US 2019/0067292 A1    Feb. 28, 2019

(30) Foreign Application Priority Data

Aug. 29, 2017  (CN) .......................... 2017 1 0755689

(51) Int. Cl.
  *H01L 27/108*  (2006.01)
  *H01L 21/311*  (2006.01)
  *H01L 21/033*  (2006.01)

(52) U.S. Cl.
  CPC .. *H01L 27/10852* (2013.01); *H01L 21/31144* (2013.01); *H01L 27/10823* (2013.01); *H01L 27/10855* (2013.01); *H01L 21/0337* (2013.01); *H01L 27/10885* (2013.01)

(58) Field of Classification Search
  None
  See application file for complete search history.

(56) References Cited

U.S. PATENT DOCUMENTS

| | | | |
|---|---|---|---|
| 9,502,285 B1 | 11/2016 | Wang | |
| 2011/0256685 A1* | 10/2011 | Suzuki | H01L 21/0331 438/381 |
| 2014/0071763 A1* | 3/2014 | Shikata | G11C 16/0483 365/185.18 |
| 2015/0255299 A1 | 9/2015 | Cantone | |
| 2016/0284798 A1* | 9/2016 | Yoshida | H01L 29/0649 |

* cited by examiner

Primary Examiner — Nishath Yasmeen
(74) Attorney, Agent, or Firm — Winston Hsu

(57) ABSTRACT

A method of forming insulating structures in a semiconductor device is provided in the present invention, which includes the steps of forming a first mask layer with mandrels and a peripheral portion surrounding the mandrels, forming spacers on sidewalls of first mask layer, filling up the space between spacers with a second mask layer, removing the spacers to form opening patterns, performing an etch process with the first mask layer and the second mask layer as an etch mask to form trenches in the substrate, and filling up the trenches with an insulating material to form insulating structures.

4 Claims, 8 Drawing Sheets

INSULATING STRUCTURE AND METHOD OF FORMING THE SAME

BACKGROUND OF THE INVENTION

1. Field of the Invention

The present invention relates generally to insulating structures and a method of forming the same. More particularly, the present invention relates to insulating structures for forming the contact plugs in memory cells and a method of forming the same.

2. Description of the Prior Art

A dynamic random-access-memory (DRAM) cell including an access transistor and a storage capacitor has become the most important storage element in an electronic system, especially in a computer and communication system. The DRAM density is increased very rapidly in order to decrease the cost per bit and, therefore, an advanced photolithography process is needed to decrease the minimum feature size of a cell.

A DRAM device comprises numerous memory cells and peripheral regions for accommodating circuit and interconnection. Each memory cell may comprise a metal-oxide semiconductor (MOS) device and one or two capacitors. Each MOS and capacitor connects with bit lines through word lines to determine the location of each memory cell. Conductive plugs are formed between bit lines and word lines to electrically connect the storage nodes with the source/drain in the active region.

In the manufacture of DRAM, a buffered oxide etch (BOE) process would be performed to open up the oxide layer between bit lines and word lines in the memory cell region and define contact holes for forming contact plugs in a subsequent process. The etchant used in this wet etch process would inevitably flow over and etch the interlayer on the peripheral region, causing undesired interlayer loss and penetration issues in the peripheral region and impact the vulnerable devices formed therein. Therefore, a need exists for an effective method to avoid the etchant flowing on the peripheral region without substantially changing the process design of DRAM.

SUMMARY OF THE INVENTION

To solve the above-mentioned interlayer loss issue, the present invention provides a novel method of forming the insulating structures used in the manufacture of contact plugs. An outer spacer structure is designed surrounding the cell region to serve as a dike and prevent the etchant in the cell region from overflowing to the peripheral region.

In one aspect of the present invention, the preferred embodiment of the present invention provides a method of forming insulating structures in a semiconductor device, which including the steps of providing a substrate, forming a first mask layer on the substrate, wherein the first mask layer includes a plurality of mandrels spaced apart from each other and extending in a first direction and a peripheral portion surrounding the mandrels, forming spacers on sidewalls of the first mask layer, wherein the spacers includes a plurality of inner spacer patterns in a loop shape spaced apart from each other and extending in the first direction and an outer spacer pattern in a loop shape surrounding the inner spacer patterns, filling up the space between the spacers with a second mask layer on the substrate, removing the spacers to form opening patterns between the first mask layer and the second mask layer, using the first mask layer and the second mask layer as an etch mask to etch the substrate and form trenches in the substrate, and filling up the trenches with an insulating material to form insulating structures in the substrate.

In another aspect of the present invention, the preferred embodiment of the present invention provides an insulating structure formed by the method provided above, which includes a substrate, a plurality of first insulating patterns in loop shape spaced apart from each other and extending in a first direction on the substrate, and a second insulating pattern in loop shape surrounding the first insulating patterns on the substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
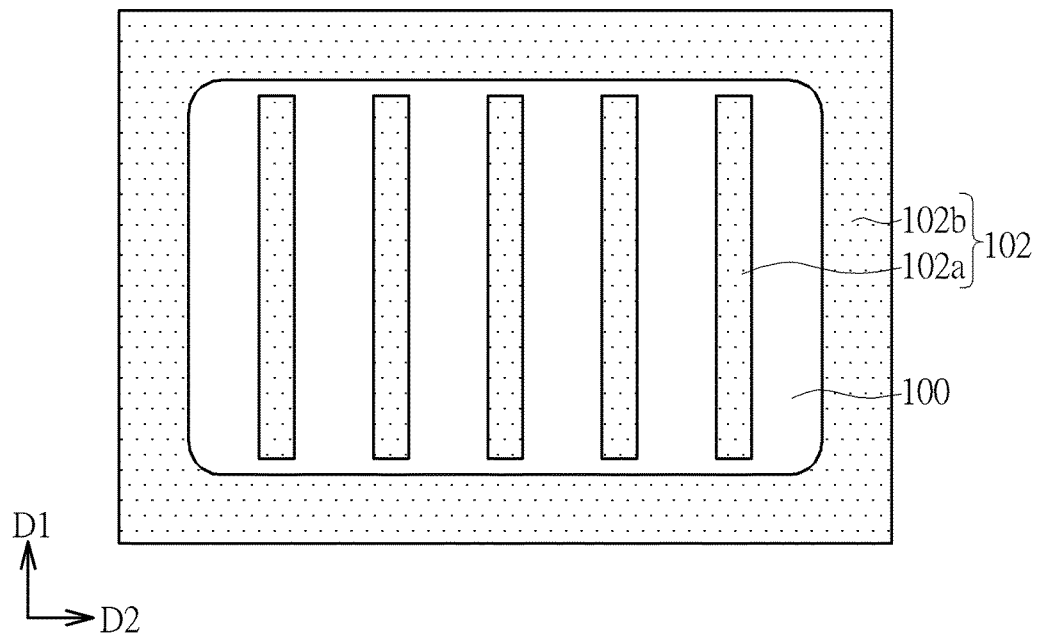
FIGS. 1-5 are top views schematically illustrating the process for forming the insulating structures in a semiconductor device in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Before describing the preferred embodiment, the following description will be given for specific terms used throughout the specification. The term "etch" or "etching" is used herein to generally describe a fabrication process of patterning a material, such that at least a portion of the material remains after the etch is completed. For example, it should be understood that the process of etching silicon involves the steps of patterning a photoresist layer above the silicon, and then removing the areas of silicon no longer protected by the photoresist layer. As such, the areas of silicon protected by the photoresist layer would remain behind after the etch process is complete. However, in another example, etching may also refer to a process that does not use a photoresist layer, but still leaves behind at least a portion of the material after the etch process is complete.

The above description serves to distinguish the term "etching" from "removing." When etching a material, at least a portion of the material remains behind after the process is completed. In contrast, when removing a material, substantially all of the material is removed in the process. However, in some embodiments, "removing" is considered to be a broad term that may incorporate etching.

The term "substrate," "semiconductor substrate" or "wafer" as described throughout, is most commonly a silicon substrate or a silicon wafer. However, term "substrate" or "wafer" may also refer to any semiconductor material such as germanium, gallium arsenide, indium phosphide, and the like. In other embodiments, the term "substrate" or "wafer" may be non-conductive, such as a glass or sapphire wafer.

FIG. 1 to FIG. 5 are schematic top views illustrating an exemplary process of forming the insulating structures in a semiconductor device in accordance with one embodiment of the invention. First, please refer to FIG. 1. The method of the present invention includes the step of providing a semiconductor substrate 100, e.g., silicon wafer. In the DRAM scheme, the substrate 100 may be substantially divided into a cell or array region for memory devices and a peripheral region for interconnection. Since the present invention is directed to the process to be performed mainly on the memory cell region, the layout and detailed description of the peripheral region will be herein omitted. In addition, the substrate 100 may be provided with bit lines and word lines formed in advance in a previous process. Nevertheless, for the simplicity of drawings and to prevent the obscuring of essential features in the present invention, the word lines, bit lines and other transistor components will not be shown in the figures unless necessary.

A first mask layer 102 is first formed on the substrate 100, wherein the first mask layer 102 includes a plurality of mandrels 102a spaced apart from each other and extending in a first direction D1 and a peripheral portion 102b surrounding the mandrels 102a. In this embodiment, the mandrels 102a are substantially distributed over the cell region, while the peripheral portion 102b preferably covers the entire peripheral region of the substrate. In this embodiment, the mandrels 102a do not connect with the peripheral portion 102b. The first direction D1 of along which the mandrels 102a extends is preferably perpendicular to the extending direction of bit lines (not shown yet) on the substrate 100. In this configuration, the substrate 100 is exposed only between the mandrels 102a and the peripheral portion 102b in the cell region. The first mask layer 102 may be a multilayer dielectric layer (MDL), such as a tri-layer structure of an organic dielectric layer (ODL), a silicon-containing hard mask bottom anti-reflection coating (SHB) and a photoresist, but not limited thereto. The first mask layer 102 formed in this step is used to define the position of spacers to be formed in subsequent process.

Figure 2:
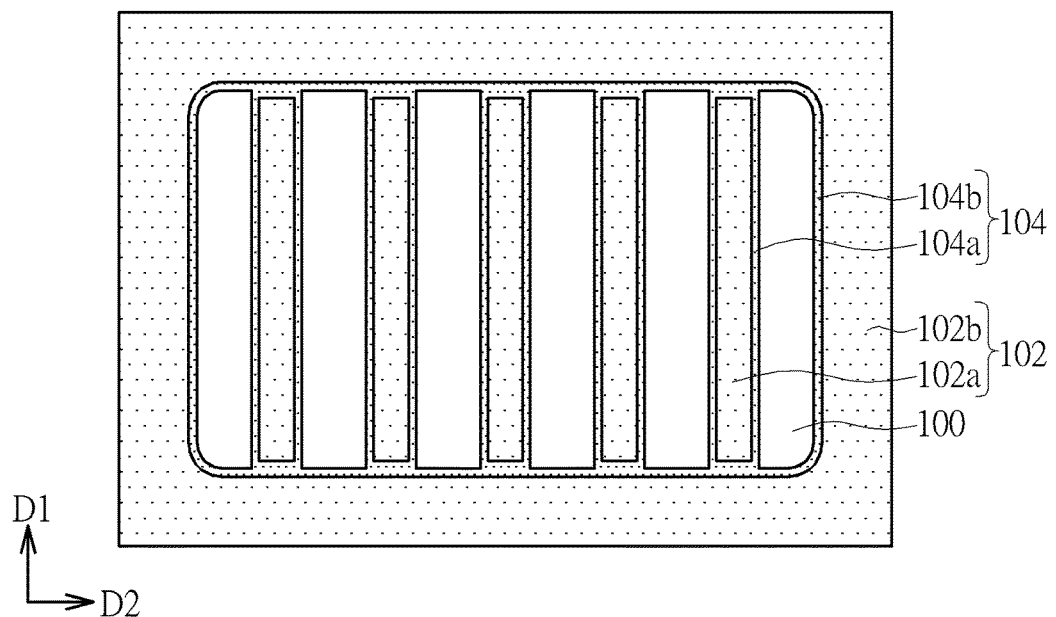

Please refer to FIG. 2. After the first mask layer 102 is formed, spacers 104 are formed on sidewalls of the first mask layer 102. The spacer 104 may include a plurality of inner spacer patterns 104a formed on sidewalls of the mandrels 102a and an outer spacer pattern 104b formed on sidewall of the peripheral portion 102b. The inner spacer pattern 104a is in a loop shape and extends in the first direction D1 like the mandrels 102a, and the outer spacer pattern 104b is in a loop shape surrounding the inner spacer patterns 104a. The spacer 104 may be formed by first depositing a conformal spacer layer on the first mask layer 102 and the substrate 100 and then performing an etch back process to the spacer layer until the top surface of the first mask layer 102 and the substrate 100 are exposed and only the spacers remaining on the sidewalls.

In this embodiment, the mandrels 102a and the peripheral portion 102b are disposed close enough so that the outer spacer pattern 104b would merge with two ends of each inner spacer pattern 104a to form fence pattern enclosed by the outer spacer. A plurality of spaces is defined between the inner spacer patterns 104a and the outer spacer pattern 104b and exposes the substrate 100 below.

Figure 3:
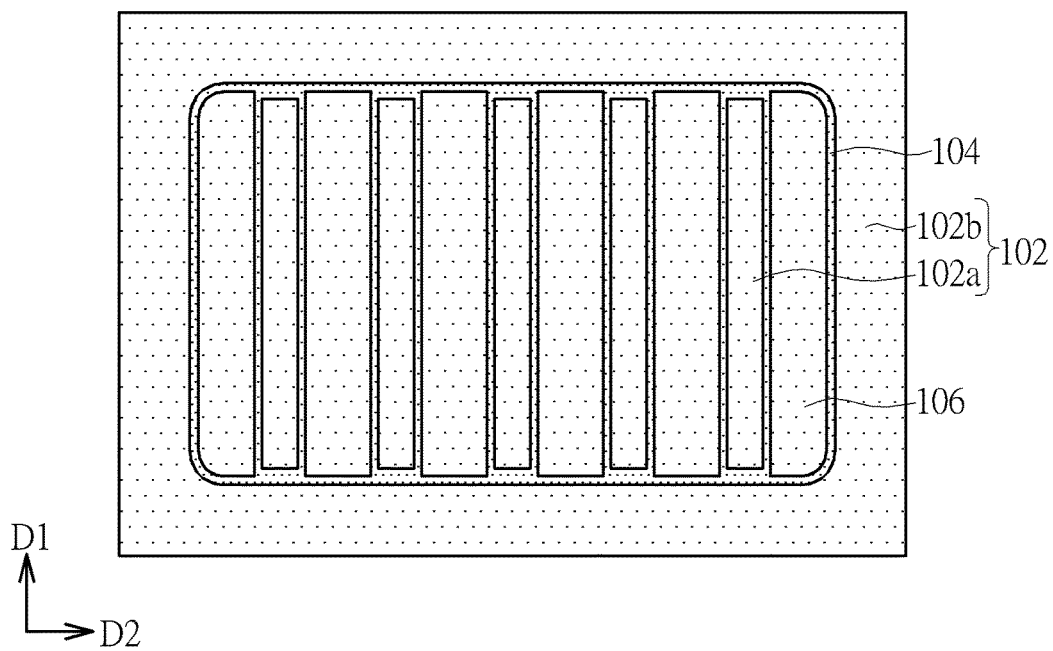

Please refer to FIG. 3. After the spacer 104 is formed, the space between the spacers defined between the inner spacer patterns 104a and the outer spacer pattern 104b is filled with a second mask layer 106. The second mask layer 106 and the first mask layer 102 may have same material, for example, a tri-layer structure of an organic dielectric layer (ODL), a silicon-containing hard mask bottom anti-reflection coating (SHB) and a photoresist. The second mask layer 106 may be formed by first covering the mask material on the first mask layer 102, the spacer 104 and the substrate 100 and then performing an etch back process to the mask material until the first mask layer 102 and the spacer 104 are exposed. After the second mask layer 106 is formed, the first mask layer 102, the second mask layer 106 and the spacer 104 would completely cover the substrate 100.

Figure 4:
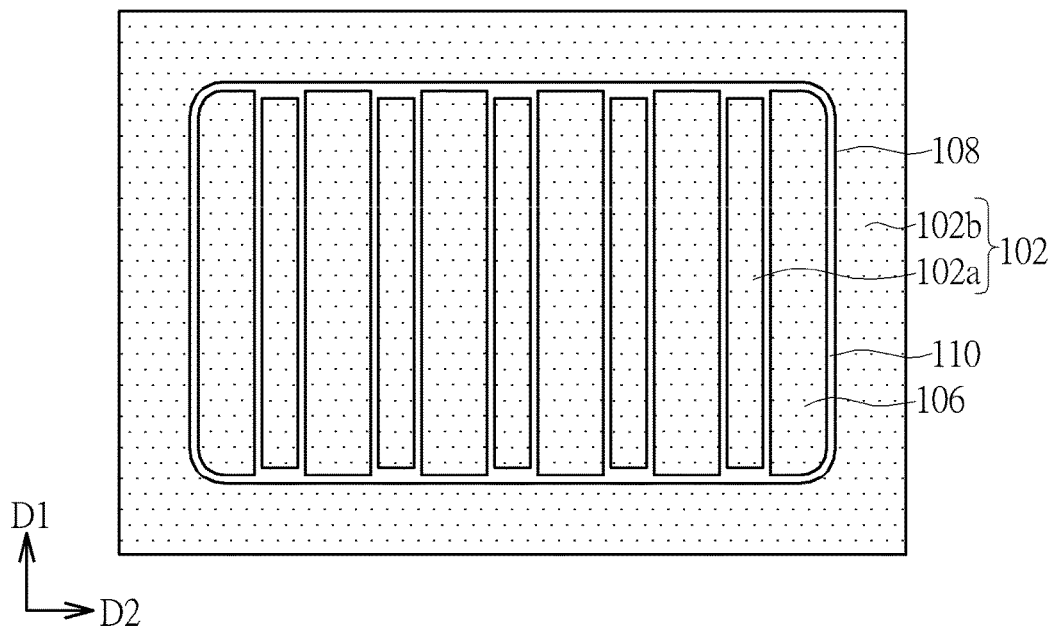

Please refer to FIG. 4. An etch process is performed to remove the spacer 104. The spacer 104 would be completely removed in this process to form opening pattern 108 between the first mask layer 102 and the second mask layer 106. The spacer 104 formed in the previous step defines shapes and positions of the opening pattern 108 between the first mask layer 102 and the second mask layer 106. After the spacer 104 is removed and the opening pattern 108 is formed, another etch process is performed to the substrate with the first mask layer 102 and the second mask layer 106 as an etch mask. The etch process would transfer the opening pattern 108 to form trenches 110 in the substrate 100 below.

In the embodiment of the present invention, the substrate below the first mask layer 102 and the second mask layer 106 may include the bit lines BL and a sacrificial oxide layer between the bit lines. The trenches 110 are formed in the sacrificial oxide layer. Please refer to FIG. 5 and FIG. 5A. The trenches 110 are filled up with an insulating material to form insulating structures 112 in the sacrificial oxide layer 114 on substrate 100. The insulating structures 112 would include a plurality of first insulating patterns 112a in a loop shape spaced apart from each other and extending in the first direction D1 in the substrate 100 and a second insulating pattern 112b in a loop shape surrounding the first insulating patterns 112a in the substrate 100. The second insulating pattern 112b merges with two ends of each first insulating pattern 112a. The insulating structure 112 of the present invention is completed in this step. Thereafter, the first mask layer 102 and the second mask layer 106 are removed to expose the bit lines BL and the sacrificial oxide layer 114 on the substrate. In the embodiment of the present invention, the outmost second insulating pattern 112b would fully encompass the bit line BL in order to fully achieve the purpose of preventing the overflowing to the peripheral region.

Figure 5:
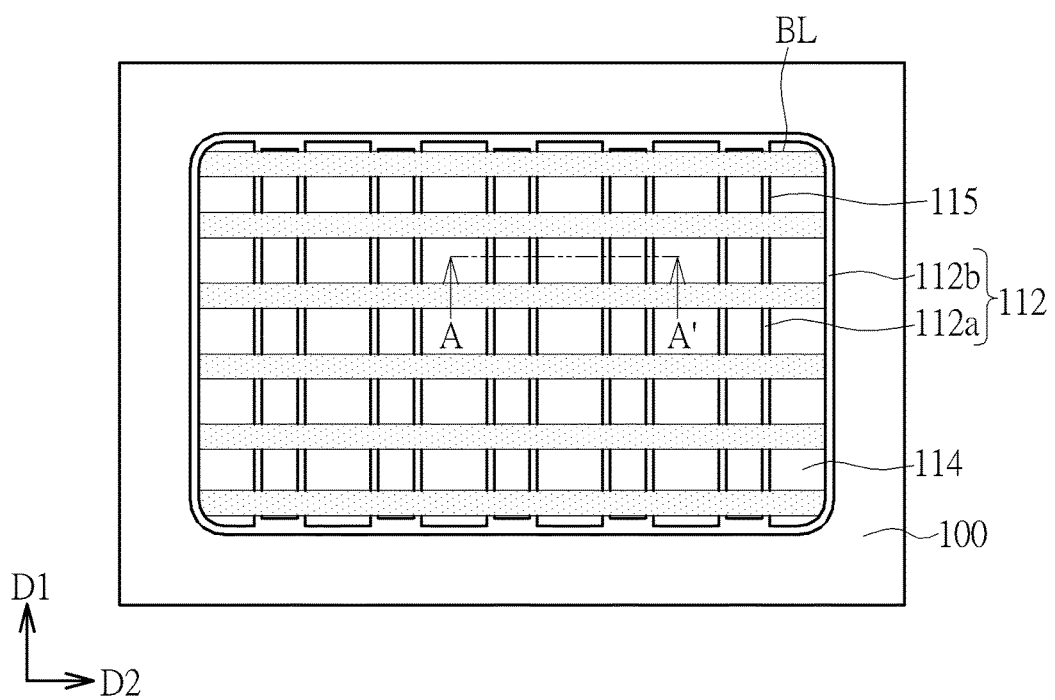
Figure 5A:
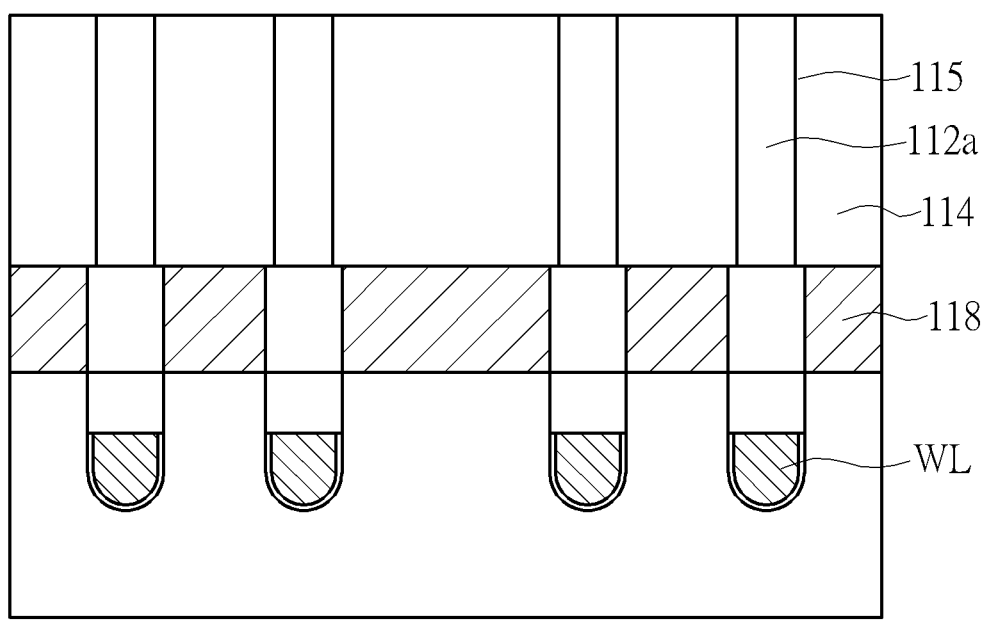
FIG. 5A is a schematic cross-sectional view taken along the line A-A' in FIG. 5.

In the embodiment of the present invention, as shown in FIG. 5 and FIG. 5A, the first insulating patterns 112a preferably intersect perpendicularly and contact directly with the bit lines BL (the line with screentone) in the substrate 100, so that the first insulating patterns 112a would be disposed between the bit lines BL and define a plurality of contact hole patterns cooperatively with the bit lines BL at the same height. The second insulating pattern 112b is preferably formed on the edge between the cell region and the peripheral region so as to serve as a dike for preventing the etchant overflow in a later process. The insulating structure 112 may have same material as the hard mask formed on the bit lines BL, such as silicon nitride or silicon carbonitride (SiCN), but not limited thereto. Furthermore, the insulating structure 112 formed in this process is preferably aligned with the word lines (as WL shown in FIG. 5A) formed in the substrate, so that the contact holes defined by the insulating structures 112 and the bit lines BL would be aligned with the landing pads 118 formed in the substrate. After the insulating structures 112 are formed, a buffer oxide etch (BOE) process is performed to remove the sacrificial oxide layer 114 between the bit lines BL and the insulating structures 112. The removal of the sacrificial oxide layer 114 would form a plurality of contact holes 115 defined by the first insulating patterns 112a and the bit lines BL in the substrate and expose the landing pads 118 thereunder.

Figure 6:
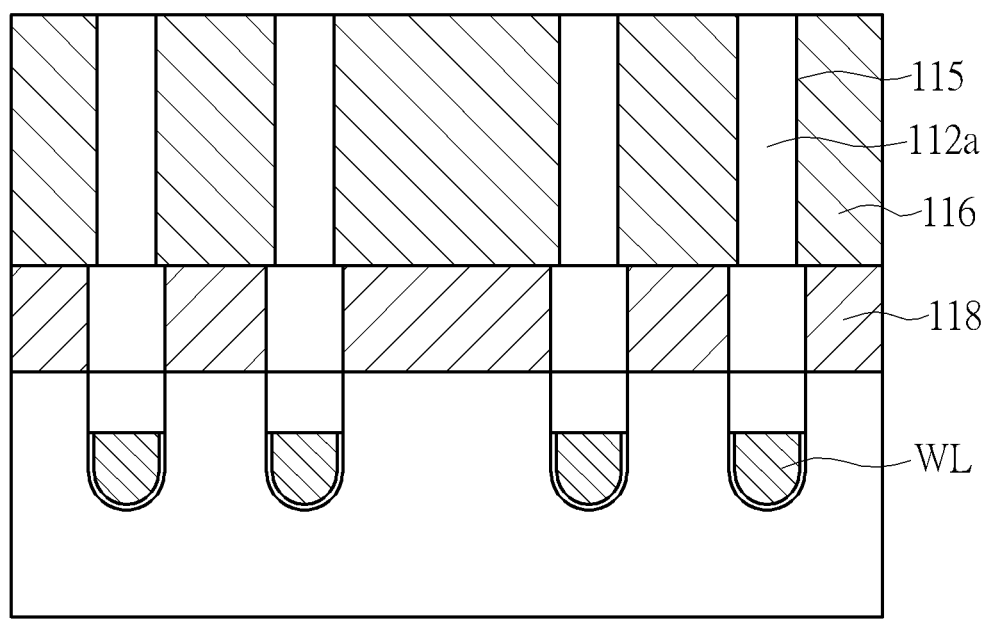
FIG. 6 is a schematic cross-sectional view taken along the line A-A' in FIG. 6A.
Figure 6A:
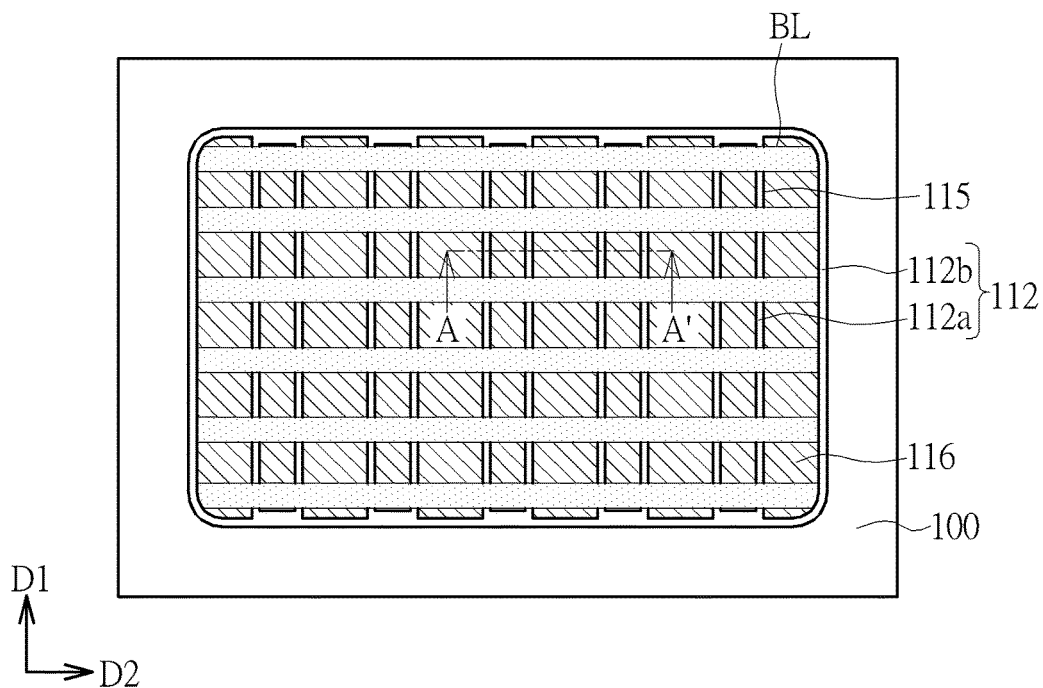
FIG. 6A is top view schematically illustrating the process for forming the insulating structures in a semiconductor device in accordance with one embodiment of the present invention.

Please refer to FIG. 6 and FIG. 6A. FIG. 6 is a schematic cross-sectional view taken along the line A-A' in FIG. 6A. After the contact holes 115 are formed, the contact holes 115 are then filled up with a conductive material, such as tungsten, to form contact plugs 116 between the first insulating patterns 112a and the bit lines BL and electrically connected with the landing pads 118 thereunder. The contact plug 116 and the landing pad 118 serve as the contact structure for the storage nodes in DRAM.

Figure 7:
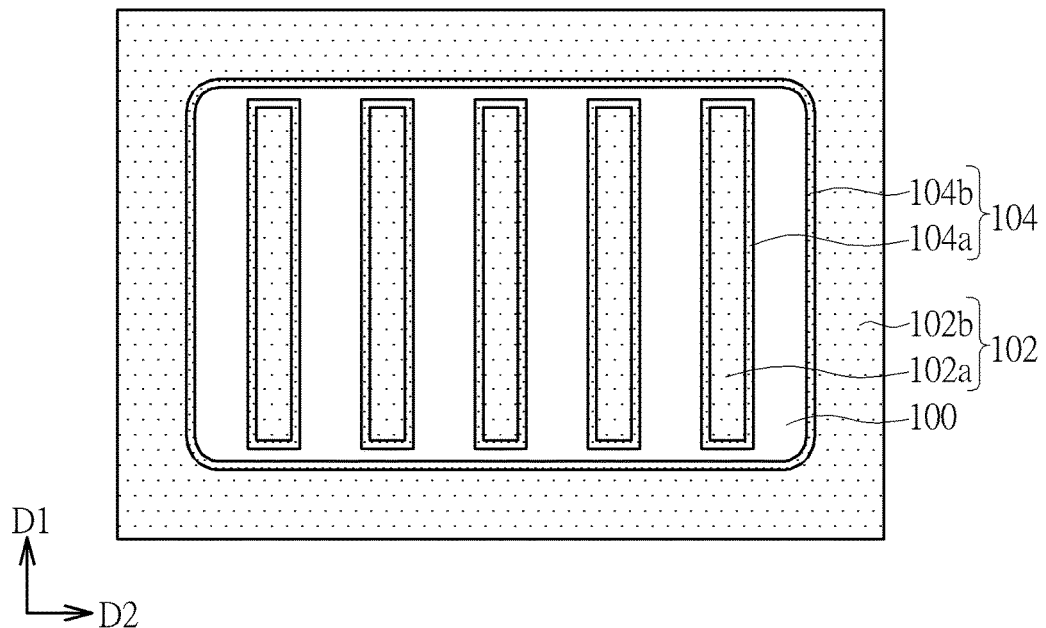
FIGS. 7 and 8 are top views schematically illustrating the variant of the insulating structures in a semiconductor device in accordance with another embodiment of the present invention.
Figure 8:
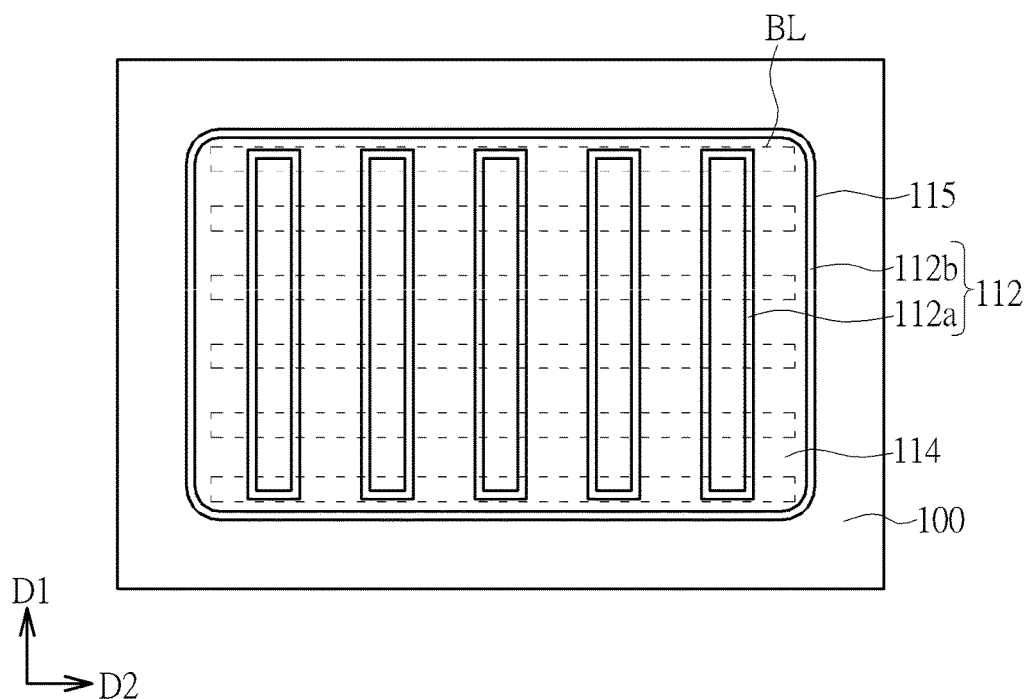

Please refer to FIG. 7 and FIG. 8. FIG. 7 and FIG. 8 are schematic top views illustrating the variant of the insulating structures in a semiconductor device in accordance with another embodiment of the present invention. In this embodiment, as shown in FIG. 7, the mandrels 102a and the peripheral portion 102b are disposed not close enough so that the outer spacer pattern 104b would not merge with two ends of each inner spacer pattern 104a. The inner spacer pattern 104a remains in the loop shape and extends in the first direction D1, and the outer spacer pattern 104b remains in the loop shape surrounding the inner spacer patterns 104a. As shown in FIG. 8, the insulating structure 112 formed in this variant still can define good contact hole pattern with the bit lines BL. The outmost second insulating pattern 112b would fully encompass the bit line BL in order to fully achieve the purpose of preventing the overflowing to the peripheral region.

Figure 9:
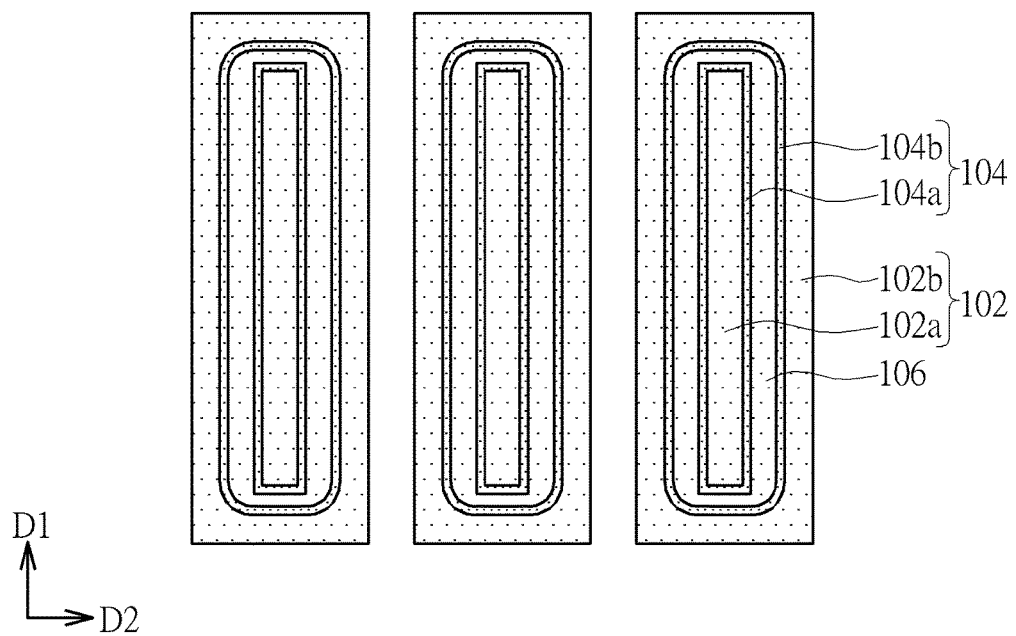
FIGS. 9 and 10 are top views schematically illustrating the variant of the insulating structures in a semiconductor device in accordance with still another embodiment of the present invention.
Figure 10:
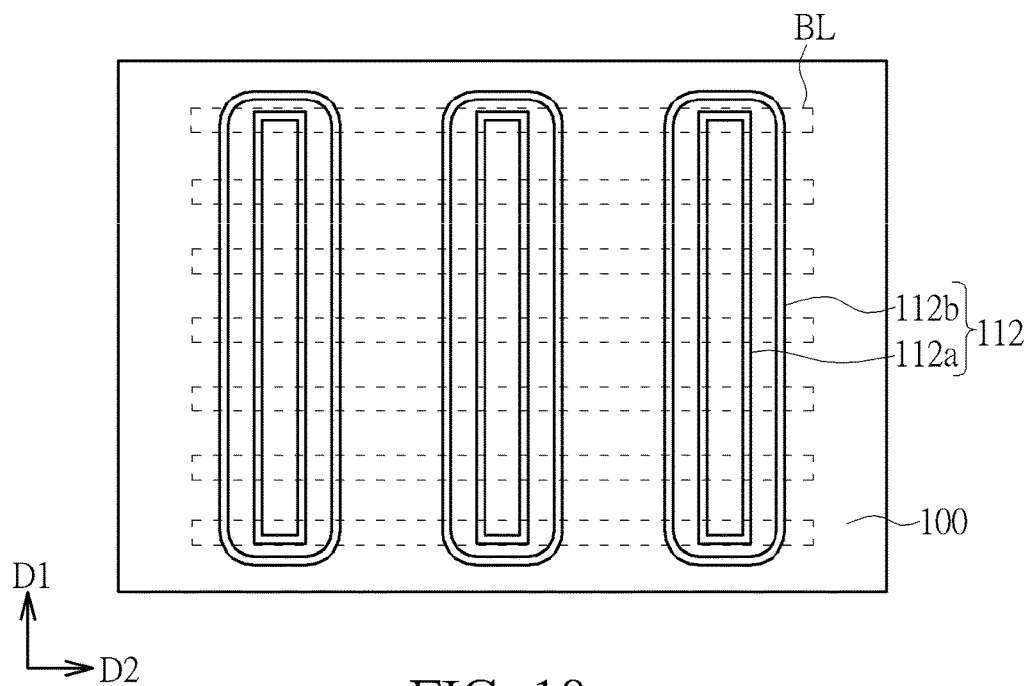

Please refer to FIG. 9 and FIG. 10. FIG. 9 and FIG. 10 are schematic top views illustrating the variant of the insulating structures in a semiconductor device in accordance with still another embodiment of the present invention. In this embodiment, as shown in FIG. 9, each mandrel 102a is surrounded by but unconnected with respective peripheral portion 102b. The second mask layer 106 is formed between each mandrel 102a and its respective peripheral portion 102b, so that each defined inner spacer pattern 104a is also surrounded by its respective outer spacer pattern 104b, which is different from the patterns that multiple inner spacer patterns 104a are surrounded by single outer spacer pattern 104b in the previous two embodiments. Thereafter, as shown in FIG. 10, the respective, individual first insulating patterns 112a and second insulating patterns 112b formed in this variant may still work efficiently to define good contact hole patterns with bit lines BL and prevent the etchant overflowing.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An insulating structure in a semiconductor device, comprising:
   a substrate;
   a plurality of first insulating patterns in a loop shape and extending in a first longitudinal direction on said substrate, wherein said first insulating patterns intersect and physically and directly contact a plurality of bit lines extending in a second longitudinal direction different from said first longitudinal direction to define a plurality of contact holes cooperatively with said bit lines at the same height, and a plurality of storage node contact plugs formed in said contact holes defined by said first insulating patterns and said bit lines and electrically connecting storage nodes; and
   at least one second insulating pattern in a loop shape surrounding said first insulating patterns on said substrate, wherein said first insulating patterns in one said second insulating pattern are spaced apart from each other.

2. The insulating structure in a semiconductor device of claim 1, wherein the material of said first insulating patterns and said second insulating pattern is silicon nitride or silicon carbonitride.

3. The insulating structure in a semiconductor device of claim 1, wherein said second insulating pattern directly merges with two ends of each said first insulating pattern.

4. The insulating structure in a semiconductor device of claim 1, wherein each said first insulating pattern is surrounded by respective said second insulating pattern.

* * * * *